United States Patent
Lesartre et al.

(10) Patent No.: US 10,275,307 B2
(45) Date of Patent: Apr. 30, 2019

(54) DETECTION OF ERROR PATTERNS IN MEMORY DIES

(71) Applicant: Hewlett Packard Enterprise Development LP, Houston, TX (US)

(72) Inventors: Gregg B. Lesartre, Fort Collins, CO (US); Craig Warner, Plano, TX (US); Martin Foltin, Fort Collins, CO (US); Chris Michael Brueggen, Allen, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 8 days.

(21) Appl. No.: 15/454,813

(22) Filed: Mar. 9, 2017

(65) Prior Publication Data

US 2018/0260273 A1 Sep. 13, 2018

(51) Int. Cl.
*G06F 11/10* (2006.01)
*G11C 29/52* (2006.01)

(52) U.S. Cl.
CPC .......... *G06F 11/1068* (2013.01); *G11C 29/52* (2013.01)

(58) Field of Classification Search
CPC .................................................. G06F 11/1076
USPC ........................................ 714/764, 766, 768
See application file for complete search history.

(56) References Cited

U.S. PATENT DOCUMENTS

| | | | |
|---|---|---|---|
| 9,015,559 B2 | 4/2015 | Shalvi | |
| 9,026,867 B1 * | 5/2015 | Northcott | G06F 11/1048 365/185.09 |
| 9,053,012 B1 * | 6/2015 | Northcott | G06F 12/0246 |
| 9,208,018 B1 * | 12/2015 | Northcott | G06F 11/1008 |
| 9,460,799 B1 | 10/2016 | Costa | |
| 9,842,660 B1 * | 12/2017 | Karamcheti | G11C 29/04 |
| 2015/0085555 A1 | 3/2015 | Carpenter | |
| 2015/0309872 A1 | 10/2015 | Cai | |

OTHER PUBLICATIONS

Kim, J. et al.; Multi-bit Error Tolerant Caches Using Two-dimensional Error Coding; https://www.ece.cmu.edu/~truss/papers/micro07-multibit.pd: Dec. 1-5, 2007.

* cited by examiner

*Primary Examiner* — Fritz Alphonse
(74) *Attorney, Agent, or Firm* — Hewlett Packard Enterprise Patent Department (57) ABSTRACT

A method is provided. In an example, the method includes identifying a memory module that includes a plurality of memory dies. Each memory die of the plurality of memory dies includes a plurality of memory regions, and each memory die of the plurality of memory dies services a respective portion of a data access. An error pattern is detected in a first memory region of the plurality of memory regions. The first memory region is associated with a first memory die of the plurality of memory dies. Based on the detected error pattern, the first memory region of the first memory die is marked as erased without marking a second memory region of the first memory die as erased.

20 Claims, 11 Drawing Sheets

DETECTION OF ERROR PATTERNS IN MEMORY DIES

BACKGROUND

Memory modules are used in transitory storage, such as Dynamic Random Access Memory (DRAM) modules. A small memory module may include thousands or millions of memory cells, while gigabit modules may include billions of cells.

Occasionally, memory modules may experience errors when the constituent memory cells store incorrect data, are unable to retrieve stored data, or experience any other read or write error. These memory errors may adversely impact the operation of the associated computing system.

BRIEF DESCRIPTION OF THE DRAWINGS

Certain examples are described in the following detailed description with reference to the drawings, of which.

Throughout the drawings, identical reference numbers may designate similar, but not necessarily identical elements.

DETAILED DESCRIPTION OF SPECIFIC EXAMPLES

A memory module, such as a Single In-line Memory Module (SIMM), Dual In-line Memory Module (DIMM), Small Outline DIMM (SO-DIMM), Gen-Z module, etc., may include a number of dies disposed on the module. The dies contain arrays of memory cells used to store data. In some examples, each unit of data is divided and distributed across the dies such that some of the dies store the data portions while other dies store corresponding recovery information, such as Error-Correcting Code (ECC). In the event of a die failure, the failed die may be marked as "erased" to signal to the ECC engine or other recovery resource to recreate the corresponding data and to prevent storing further data to the failed die. In response to the erased designation, the ECC engine may recreate data on the failed die using the data and ECC stored on the remaining dies. While the memory may continue to operate using the remaining dies, further errors in other dies may render data irrecoverable due to the degraded redundancy.

In some examples, a pattern of memory errors is analyzed and used to minimize the amount of the die that is marked as erased and correspondingly minimize the amount of the memory module that is operating with degraded redundancy. The memory cells within a die may be laid out in repeating structures, such as banks, that operate independently. Accordingly, because of this independence, failures may be limited to certain banks of a die rather than an entire die. Therefore, in some such examples, a controller assess each die as a set of regions, where each region includes a number of banks and/or sub-banks. The controller tracks memory errors region-by-region to identify the failing region(s) and thereby determine how much of a die has failed. Based on this information, the controller marks individual failing regions as erased, leaving the remainder of the die unmarked and operational. Because data may be read from and written to the remaining regions of the die, data integrity and redundancy is maintained for at least part of the memory module.

To track the memory errors, the controller may initialize error counters for the memory module such that an error counter is assigned to each individual die region. To conserve error counters, in some examples, the controller adjusts the granularity of the counters when a pattern of errors is detected to hone in on a failing region. In some such examples, the controller first initializes the error counters using a relatively large granularity to distribute the counters across the entire memory module. When a pattern of errors is detected, the controller redistributes the counters with a finer granularity so that the failing die is divided into more regions of smaller size. This may allow the controller to identify the scope of the failure with precision and to accurately discern the size of the failed region.

By these mechanisms and others, the present disclosure provides substantial real-world improvements to the operation and resiliency of computer memory. For instance in many examples, by determining that errors are limited to a region of a die and by designating the region as erased, other regions on the same die that are not compromised continue to operate. The data associated with the operational portions of the die does not suffer degraded redundancy. This may also reduce the burden on an ECC engine used to reconstruct data in the erased region. In many examples, the size of the erased region is adjusted based on the error pattern to avoid under- or overcorrection. In many examples, a memory controller reallocates error counters from operational dies to a suspected failing die upon detecting errors in order to accurately determine the scope of the failing region without the overhead of additional static error counters.

These examples and others are described with reference to the following figures. Unless noted otherwise, the figures and their accompanying description are non-limiting, and no element is characteristic of any particular example. In that regard, features from one example may be freely incorporated into other examples without departing from the spirit and scope of the disclosure.

Figure 1:
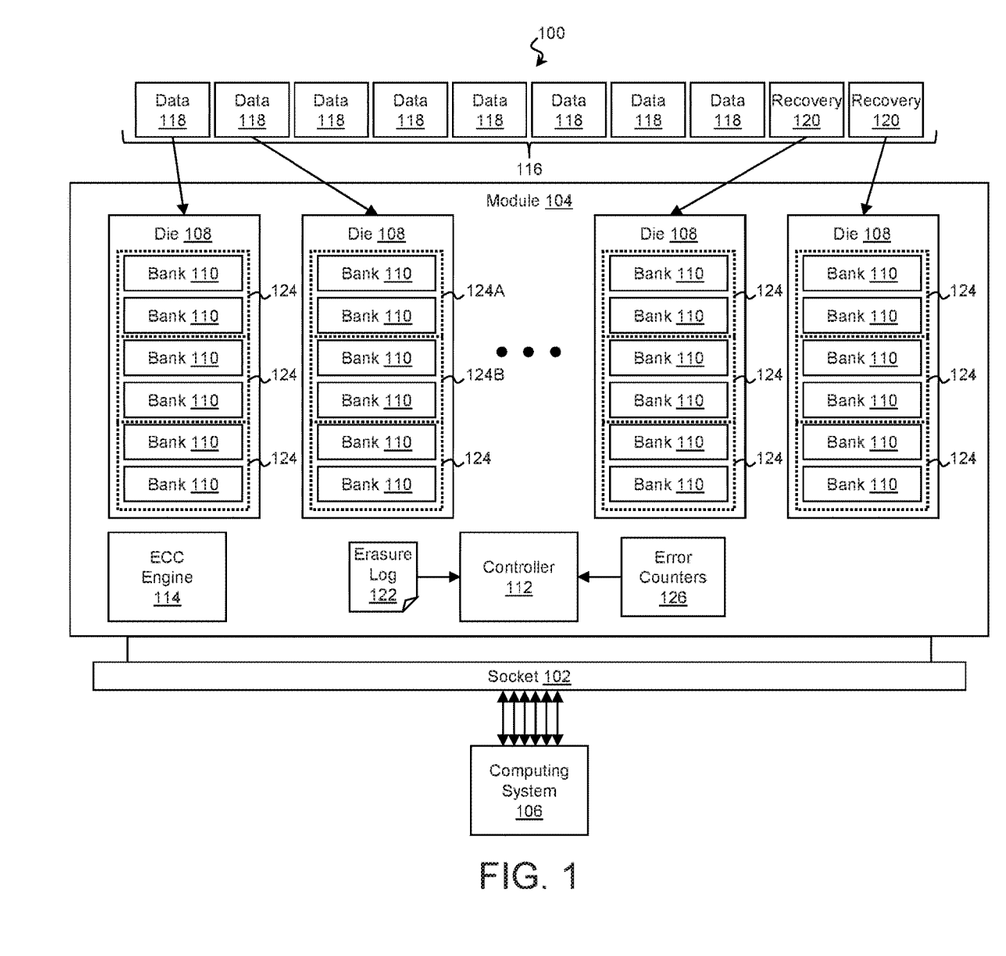
FIG. 1 is a block diagram of a computing environment according to some examples of the present disclosure.

A computing environment for practicing the technique of the present disclosure is described with reference to FIG. 1. In that regard, FIG. 1 is a block diagram of a computing environment 100 according to some examples of the present disclosure. While illustrated as a single unitary entity, the computing environment 100 may represent the processes and resources of any number of computing devices operating together in order to perform a common function.

The computing environment 100 includes a socket 102 for receiving a memory module 104. Together the socket 102 and the memory module 104 may conform to any suitable form factor, such as DIMM socket/DIMM, SO-DIMM socket/SO-DIMM, SIMM socket/SIMM, Gen-Z module, etc. The socket 102 physically and electrically couples the memory module 104 to a computing system 106 such that the computing system 106 may access (e.g., read, write, and/or otherwise access) data stored on the memory module 104. The computing environment 100 may represent a single unitary computing system, a cluster of discrete computing systems, or any permutation thereof.

The memory module 104 received in the socket 102 may include a plurality of memory-containing dies 108 physically and electrically coupled to the memory module 104. In turn, the dies 108 may include a number of memory cells for storing data of the memory module 104. Arrays of memory cells may be physically arranged into banks 110 of a die 108, with a single die 108 including any number of banks 110. Each bank 110 may include its own control circuitry (e.g., read circuitry, write circuitry, word-line controllers, bit-line controllers, sense amplifiers, etc.) to read from and write to the memory cells, and banks 110 may access data independently of other banks 110.

The memory cells within the banks 110 may be of any suitable type and technology. In some examples, the memory module 104 is a volatile memory module, and the banks 110 of the dies 108 include volatile memory cells, such as Dynamic Random Access Memory (DRAM) and/or Static Random Access Memory (SRAM) cells. In some examples, the memory module 104 is a non-volatile memory module, and the banks 110 of the dies 108 include non-volatile memory cells, such as flash memory cells, memristive memory cells, etc.

In some examples, the module 104 includes a memory controller 112 that accesses (e.g., reads, writes, and/or otherwise accesses) data stored on the dies 108 of the memory module 104. The banks 110 of a die 108 may be coupled in parallel with data distributed across the banks 110 so that data is read from and written to the banks 110 of a die 108 concurrently. Similarly, the dies 108 of the memory module 104 may be coupled in parallel with data distributed across the dies 108 so that the controller 112 may access the dies 108 concurrently. In some such examples, the controller 112 divides a basic unit 116 of a data access, such as a cache-line sized unit, among the dies 108 so that each die 108 services a portion of the data access concurrently and in parallel. In so doing, the controller 112 may divide the unit of data 116 into a number of data portions 118 and a number of recovery portions 120, with each portion stored on a respective die 108.

In more detail, a given unit of data 116 may include data and recovery information used to detect errors in the data and to recover lost or damaged portions of the data. The recovery information provides redundancy and protection, and any suitable error recovery scheme may be used. For example, the unit of data 116 may be structured as an ECC word, with the unit of data 116 divided into eight data portions 118 and two ECC recovery portions 120, although any other division and number of recovery portions 120 may be used. Each data portion 118 and recovery portion 120 may be stored on a separate die 108 of the module 104. Furthermore, in some examples, a die 100 may store a portion with a combination of both data and ECC.

The recovery information in the recovery portions 120 may be used by an ECC engine 114 of the module 104 to detect and correct errors, such as read errors and/or write errors, when accessing the memory module 104. These errors may include transient errors, localized persistent faults, and/or larger-scale persistent faults. While transient errors may include one-time glitches that are not indicative of future errors, persistent faults indicate further attempts to read or write the affected memory cells will not be successful. When a portion of a memory die 108 experiences a number of errors or faults, the controller 112 may mark the affected portion as "erased" in an erasure log 122 to prevent future read and write attempts. The ECC engine 114 may recover data stored on an erased memory die 108 using the rest of the unit of data 116 including data portions 118 and recovery portions 120 stored on the other memory dies 108. However, the lost data may cause the memory module 104 to experience degraded redundancy, and in some examples, a single additional error (transient or persistent) will cause irrecoverable data errors.

The banks 110 that make up a die 108 may be independent and have independent control circuitry, and accordingly, a failure in one bank 110 may not impact other banks 110 of the same die 108. Therefore, to minimize the amount of the memory module 104 that experiences degraded redundancy, the controller 112 may analyze a pattern of errors to determine which regions of a die 108 have experienced a persistent fault. In some examples, the controller 112 divides the die 108 into a set of regions 124 that each include a number of banks 110 and/or sub-banks 110. The controller 112 determines a region 124 (e.g., region 124A) that has experienced a persistent fault and marks the region 124A as erased without marking other region(s) 124 in the same die 108 that have not experienced the fault. By marking only the failed region 124A as erased, units of data 116 stored in other regions 124 of the die 108 retain their data redundancy and are not degraded. This may provide greater resiliency. Furthermore, in some examples, not marking regions 124 that have not experienced the persistent fault relieves the ECC engine 114 from the overhead of recovering data that can be successfully read from these regions 124 of the die 108.

To make this determination, the controller 112 may initialize a set of error counters 126 to track errors of the memory module 104. The controller 112 may allocate the counters 126 among the regions 124 of the dies 108 such that each region 124 has an associated counter 126 to record errors that occur within the respective region 124. The controller 112 then examines the error counters 126 to detect an error pattern that indicates a persistent fault. To distinguish between a transient error and a persistent fault, a scrub or test write may be made to the corresponding memory cell(s) to determine whether the memory cell(s) retain a value. Additionally, or in the alternative, aspects of the error pattern may be used to determine whether the errors are due to a transient error or a persistent fault, such as the number, frequency, and/or type of errors encountered. When the controller 112 detects an error pattern that corresponds to a persistent fault in a region 124 (e.g., region 124A), the controller marks the corresponding region 124A as erased in an erasure log 122 without marking other regions 124 (e.g., region 124B) in the same die 108.

Figure 2:
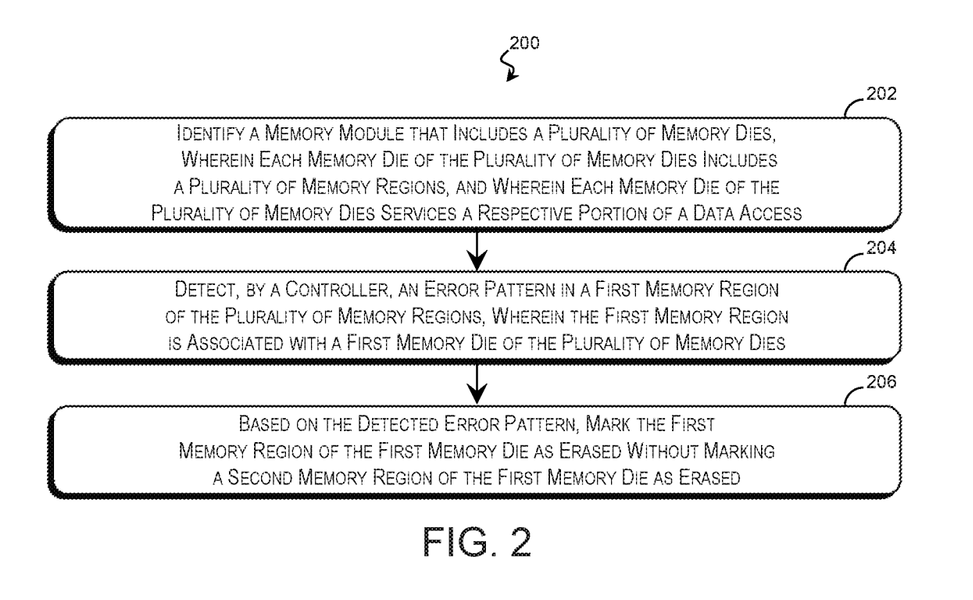
FIG. 2 is a flow diagram of a method of detecting an error pattern and marking a memory region according to some examples of the present disclosure.
Figure 3:
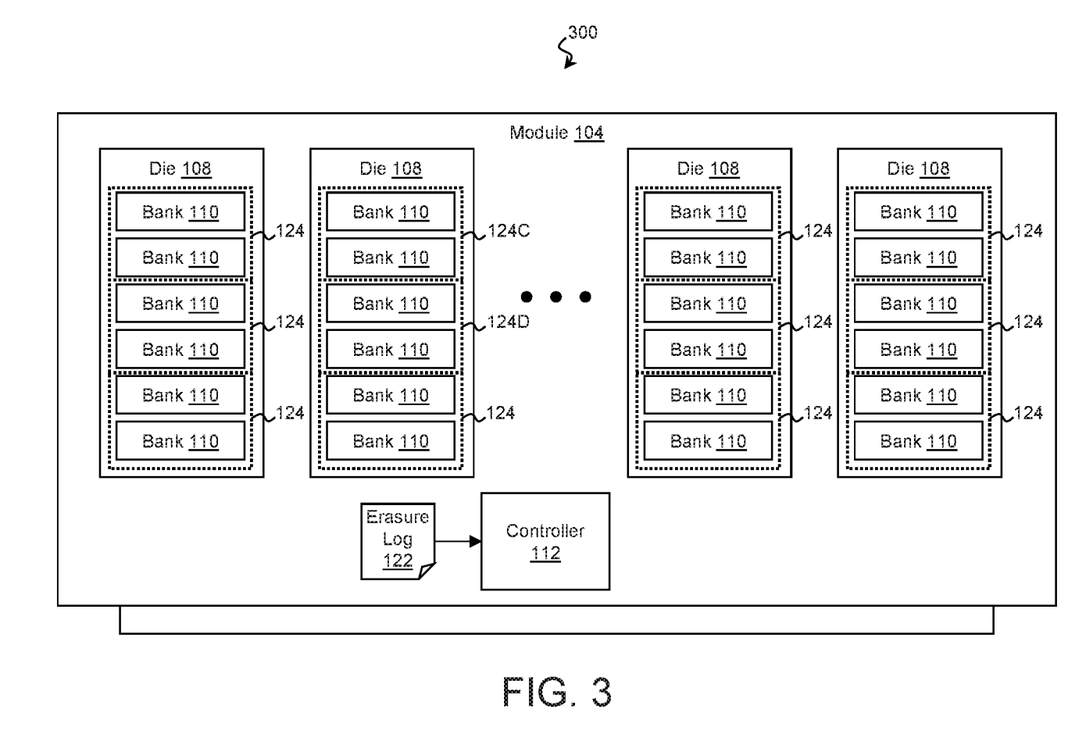
FIG. 3 is a block diagram of a computing environment performing a method of detecting an error pattern and marking a memory region according to some examples of the present disclosure.

Examples of the technique are described with reference to FIGS. 2 and 3. In that regard, FIG. 2 is a flow diagram of a method 200 of detecting an error pattern and marking a memory region according to some examples of the present disclosure. The description of the method 200 is non-limiting, and steps may be added to and omitted from the method 200 without departing from the disclosure. Furthermore, unless noted otherwise, processes of the method 200 may be performed in any order including being performed concurrently by one or more entities. FIG. 3 is a block diagram of a computing environment 300 performing the method 200 of detecting an error pattern and marking a memory region according to some examples of the present disclosure. The computing environment 300 includes a memory module 104 with a controller 112 and a plurality of dies 108 each having a plurality of memory banks 110 of memory cells, each substantially as described in FIG. 1

Referring to block 202 of FIG. 2 and to FIG. 3, the memory module 104, which includes the plurality of memory dies 108, is identified. The memory dies 108 are communicatively coupled in parallel on the memory module 104 such that each memory die 108 services a respective portion (e.g., data portion 118 or recovery portion 120) of a unit of data 116 that makes up a data access. In identifying the memory module 104, the controller 112 of the memory module may group the memory banks 110 of the memory dies 108 into regions 124 (e.g., memory regions 124C and 124D) such that each memory die 108 includes a plurality of regions 124.

Referring to block 204 of FIG. 2, the controller 112 detects an error pattern in a first region 124C of one of the memory dies 108. The error pattern may be detected in response to reading, writing, and/or otherwise accessing the memory module 104. The error pattern may correspond to a persistent fault within the first memory region 124C as opposed to a transient event.

Referring to block 206 of FIG. 2 and to FIG. 3, the controller 112 marks the first region 124C as erased in an erasure log 122 based on the error pattern detected in block 204. The controller 112 may do so without marking other regions of the same memory die 108 as erased, such as memory region 124D, if the error pattern is confined to the first memory region 124C.

Figure 4:
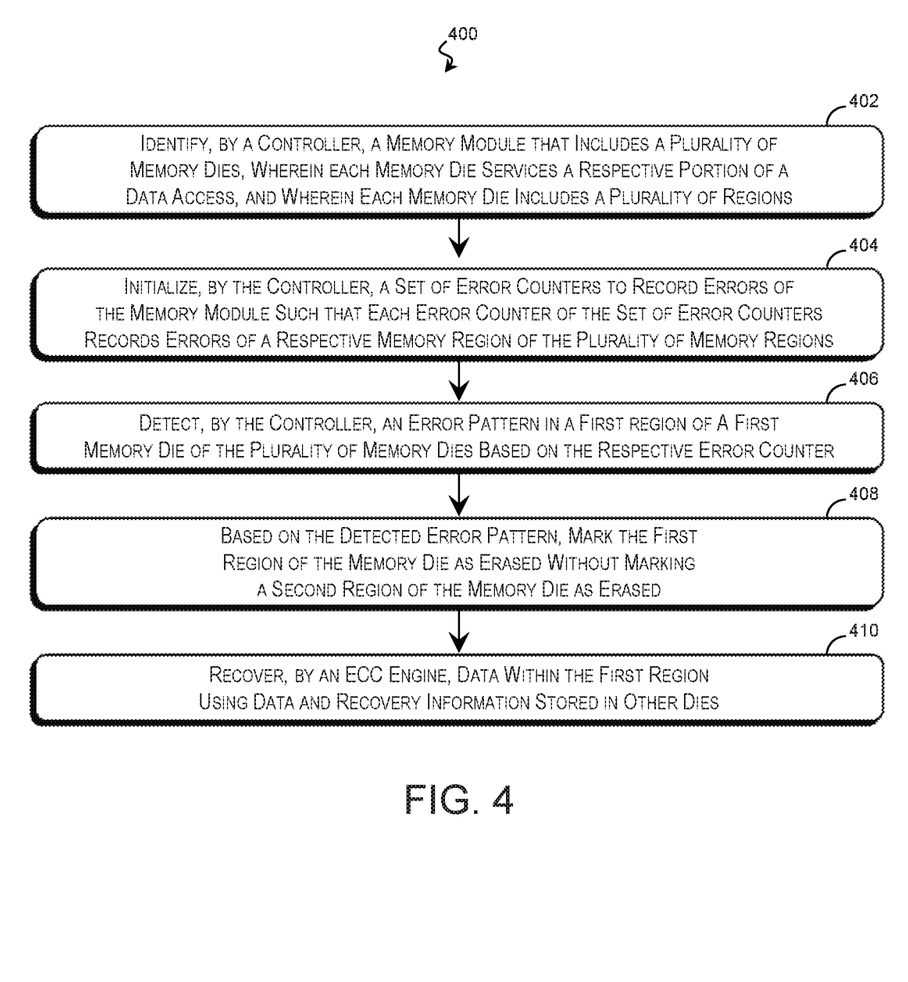
FIG. 4 is a flow diagram of a method of detecting an error pattern in a memory region using a set of error counters according to some examples of the present disclosure.
Figure 5:
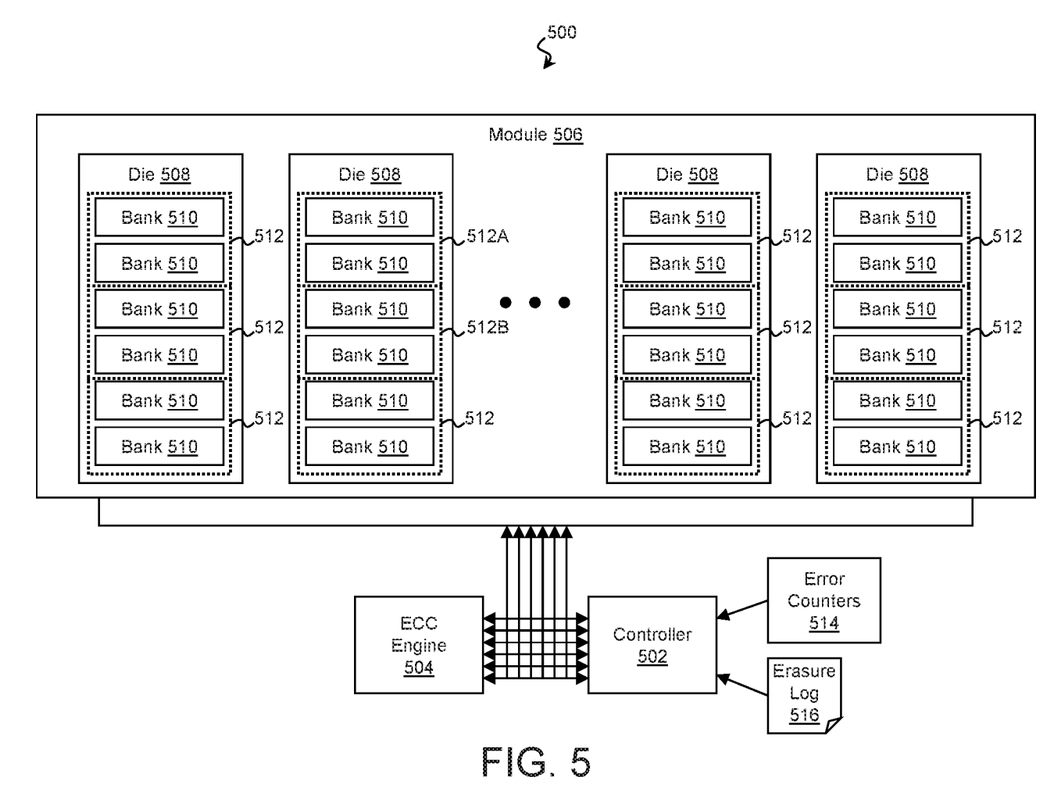
FIG. 5 is a block diagram of a computing environment performing a method of detecting an error pattern according to some examples of the present disclosure.

Any suitable technique may be used to detect the aforementioned error pattern, and some examples are described with reference to FIGS. 4 and 5. In that regard, FIG. 4 is a flow diagram of a method 400 of detecting an error pattern in a memory region using a set of error counters according to some examples of the present disclosure. The description of the method 400 is non-limiting, and steps may be added to and omitted from the method 400 without departing from the disclosure. Furthermore, unless noted otherwise, processes of the method 400 may be performed in any order including being performed concurrently by one or more entities. FIG. 5 is a block diagram of a computing environment 500 performing the method 400 of detecting an error pattern according to some examples of the present disclosure.

The computing environment 500 includes a controller 502 and an ECC engine 504, substantially similar to the controller 112 and ECC engine 114 of FIGS. 1 and 3 in many aspects. In the illustrated examples, the controller 502 and ECC engine 504 are physically separate from a corresponding memory module 506 and communicatively coupled thereto, although the controller 502 and ECC engine 504 may be physically incorporated into the memory module 506.

Referring to block 402 of FIG. 4 and to FIG. 5, the controller 502 identifies the memory module 506 that includes a plurality of memory dies 508, where each memory die 508 services a respective portion (e.g., a data portion or a recovery portion) of a data access. This may be performed substantially as described in block 202 of FIG. 2.

In identifying the memory module 506, the controller 502 may determine the number and type of the memory dies 508 in the memory module 506 and may group memory banks 510 of the memory dies 508 into regions 512 (e.g., memory regions 512A and 512B) such that each memory die 508 includes a plurality of regions 512.

Referring to block 404 of FIG. 4 and to FIG. 5, the controller 502 initializes a set of error counters 514 and allocates the error counters 514 among the memory module 506 such that an error counter 514 is allocated to each respective region 512 to record errors occurring therein. The error counters 514 may detect errors that occur while reading, writing, and/or otherwise accessing the memory module 506.

Referring to block 406 of FIG. 4, the controller 502 detects an error pattern in a first region 512A of one of the memory dies 508 based on the respective error counter 514. This may be performed substantially as described in block 204 of FIG. 2. The error pattern may correspond to a persistent fault within the first memory region 512D as opposed to a transient event.

Referring to block 408 of FIG. 4 and to FIG. 5, the controller 502 marks the first region 512D as erased in an erasure log 516 based on the error pattern detected in block 406. This may be performed substantially as described in block 206 of FIG. 2. The controller may do so without marking other regions of the same memory die 508 as erased, such as memory region 512B, if the error pattern is confined to the first memory region 512A.

Referring to block 410 of FIG. 4 and to FIG. 5, in response to the marking in the erasure log 516, the ECC engine 504 recovers and/or recreates data in the erased first region 512A using data portions and recovery portions stored in other dies 508. Because the controller 502 precisely identifies the region(s) of the memory module 506 that are experiencing errors, the ECC engine 504 is relieved of the burden of recovering data in other regions (e.g., second region 512B) where the data is otherwise retrievable.

Figure 6:
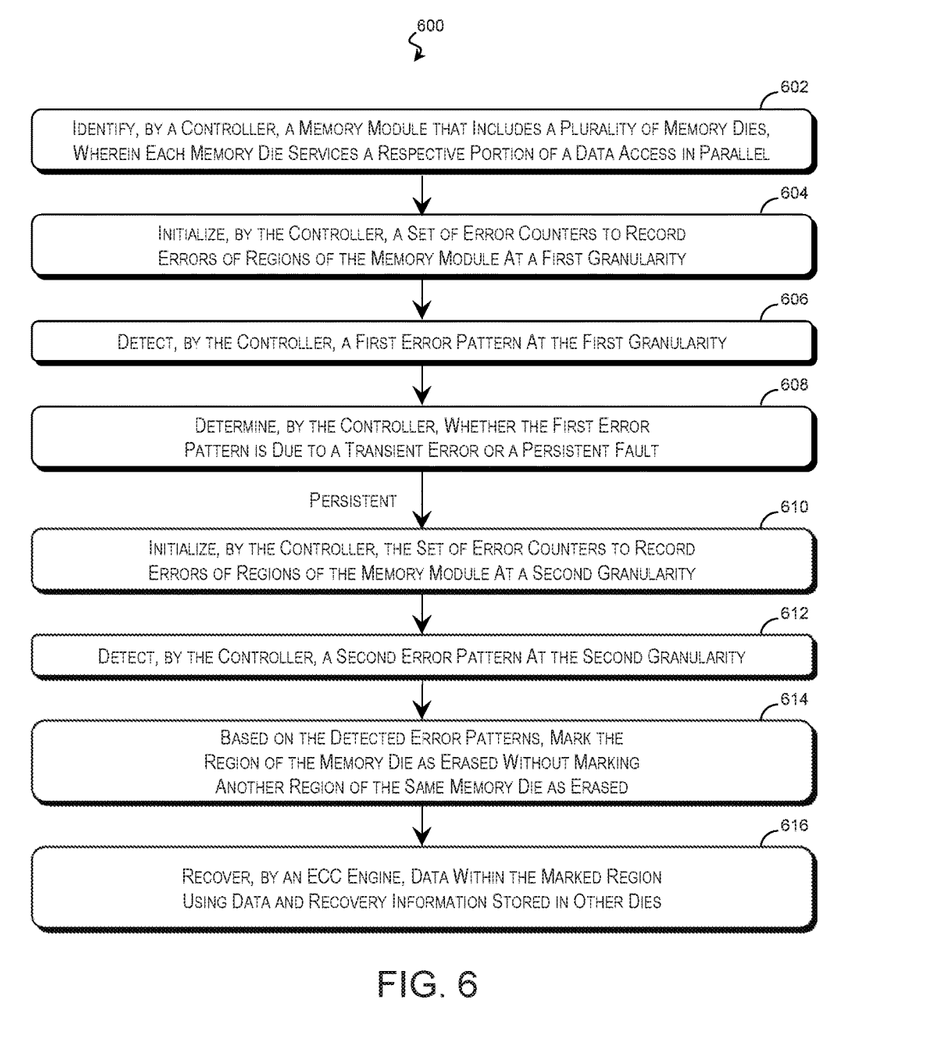
FIG. 6 is a flow diagram of a method of determining a scope of a failure in a memory module according to some examples of the present disclosure.
Figure 7A:
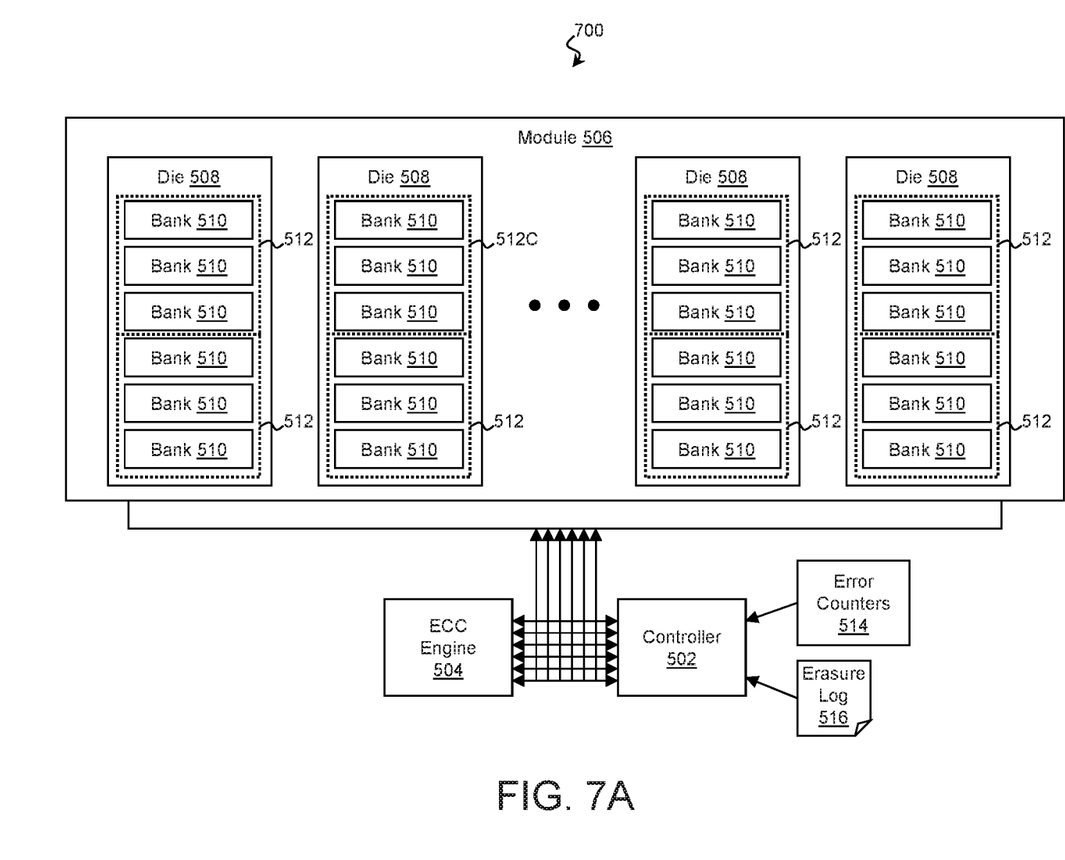
FIGS. 7A-7C are block diagrams of a computing environment at various points in time according to some examples of the present disclosure.
Figure 7B:
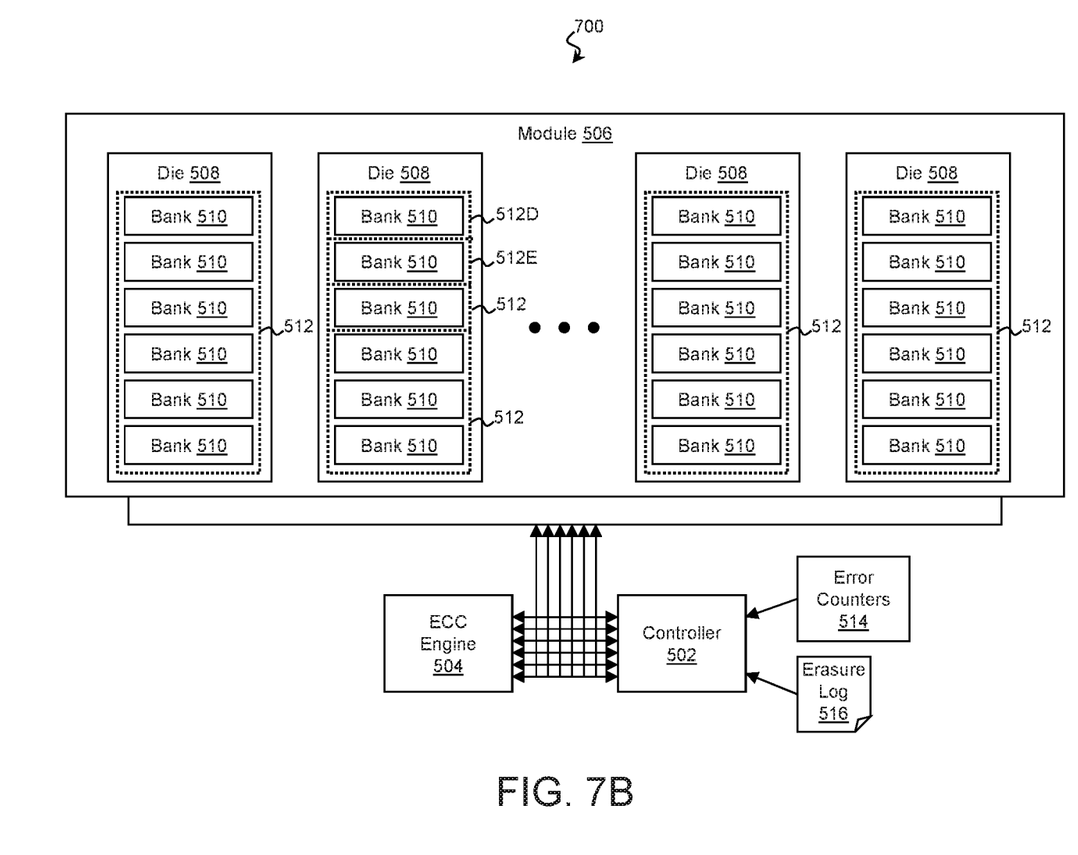
Figure 7C:
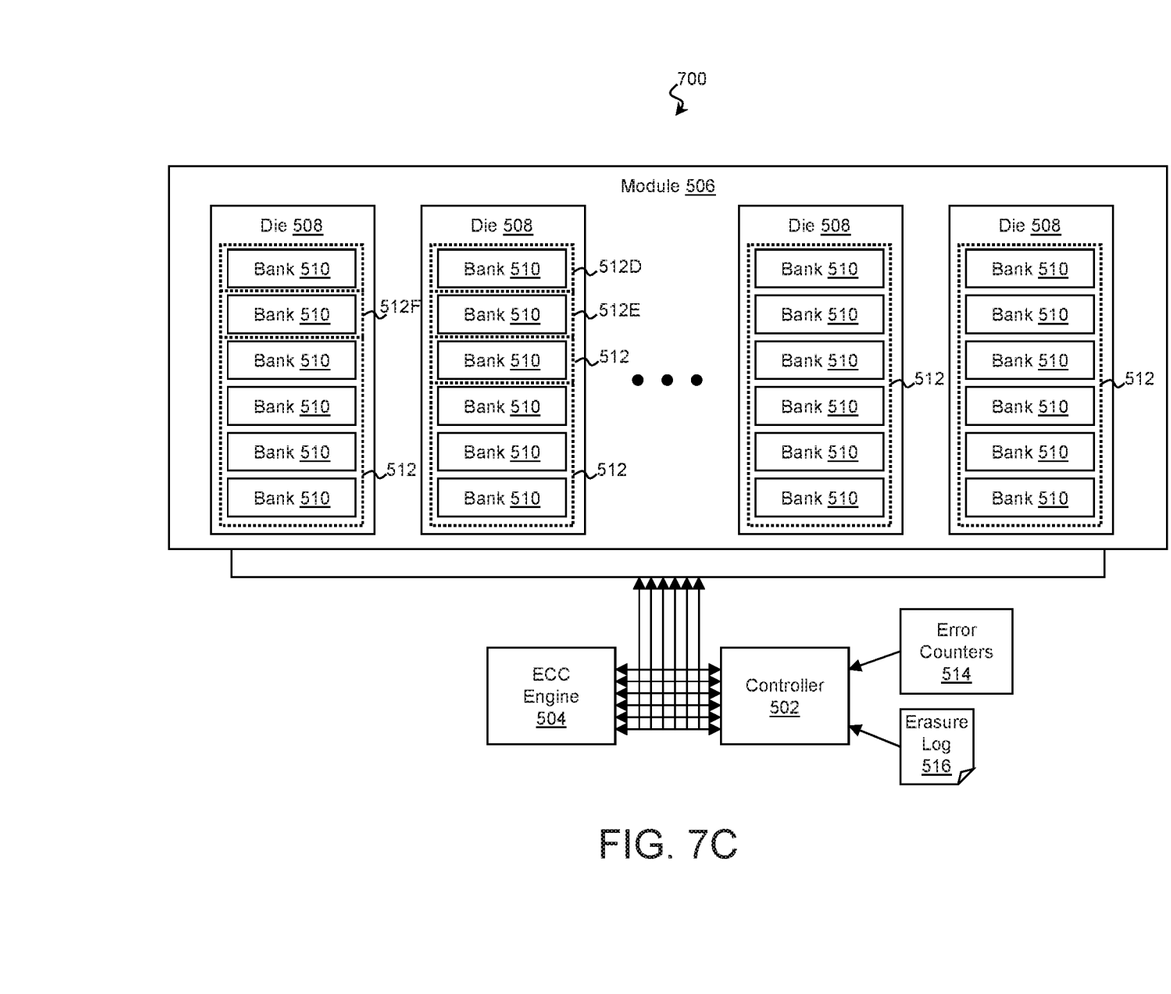

To utilize the counters 514 efficiently, the controller 502 may reallocate the counters 514 from dies 508 that have not experienced a persistent fault to a die 508 that has as described in FIGS. 6 and 7A-7C. In that regard, FIG. 6 is a flow diagram of a method 600 of determining a scope of a failure in a memory module according to some examples of the present disclosure. The description of the method 600 is non-limiting, and steps may be added to and omitted from the method 600 without departing from the disclosure. Furthermore, unless noted otherwise, processes of the method 600 may be performed in any order including being performed concurrently by one or more entities. FIGS. 7A-7C are block diagrams of a computing environment 700 at various points in time according to some examples of the present disclosure. The computing environment 700 includes a controller 502 with a set of error counters 514 and a memory module 506 with a plurality of dies 508 each having a plurality of memory banks 510 of memory cells, each substantially as described above.

Referring to block 602 of FIG. 6 and to FIG. 7A, the controller 502 identifies the memory module 506 and the plurality of memory dies 508. This may be performed substantially as described in block 202 of FIG. 2 and/or block 402 of FIG. 4. In identifying the memory module 506, the controller 502 may determine the number and type of the memory dies 508 in the memory module 506. As described above, the memory dies 508 may be communicatively coupled in parallel such that each memory die 508 services a respective portion of a data access in parallel.

Referring to block 604 of FIG. 6 and to FIG. 7A, the controller 502 initializes the set of error counters 514 to record errors of the memory module 506. This may be performed substantially as described in block 404 of FIG. 4. Initializing the error counters 514 may include dividing the memory banks 510 of the memory dies 508 into regions 512 (including region 512C) of a first granularity. For example, in FIG. 7A, each die 508 has two regions 512 defined therein at the first granularity. The controller 502 allocates the error counters 514 among the regions 512 such that each region 512 has a corresponding error counter 514 is allocated to the region 512 to record errors occurring within.

Referring to block 606 of FIG. 6 and to FIG. 7A, the controller 502 detects a first error pattern in the memory module 506 using the set of error counters 514 having the first granularity. In the example of FIG. 7A, the first error pattern corresponds to region 512C.

Referring to block 608 of FIG. 6, the controller 502 determines whether the first error pattern is due to a transient error or a persistent fault. In so doing, an ECC engine 504 may recover data associated with the error pattern using data portions or recovery portions stored in other dies 508 of the memory module 506. This recovered data may be used to determine whether the error pattern is due to a persistent fault by attempting write the recovered scrub data to the corresponding memory cell or cells. If the data is successfully read from one of the memory cells, it may indicate that the cell is able to retain data and that the associated error was a transient error. However, if the cell is unable to retain the data, it may indicate a persistent fault.

Furthermore, certain types or numbers of errors may indicate a persistent fault, even if the associated memory cells pass a scrub write test. Accordingly, aspects of the error pattern may be used to determine whether the errors of the pattern are due to a transient error or a persistent fault such as the number, frequency, and/or type of errors encountered. In some examples, the determination includes comparing the error counters 514 to each other to recognize an error counter 514 with a statistically significant deviation from the remaining error counters 514. Such a deviation in an error counter 514 may indicate a persistent fault in the corresponding region.

If the first error pattern is due to a transient error, the ECC engine 504 may have already recovered any lost data in block 608, and the method 600 may end. Conversely, if the first error pattern indicates that a persistent fault within the memory module 506 has occurred, error counters 514 may be reassigned from parts of the memory module 506 that have not experienced a persistent fault to parts that are. Referring to block 610 of FIG. 6 and to FIG. 7B, the controller 502 initializes the set of error counters 514 to record errors of the memory module 506 at a second granularity that is different from the first granularity. In some examples, error counters assigned to dies 508 that have not experienced the persistent fault are reassigned to record errors for regions 512 of a die 508 that are. In the examples of FIG. 7B, additional counters 514 have been allocated to the die 508 experiencing the first error pattern such that the die now has four regions 512 (including regions 512D and 512E) defined therein. As can be seen, by reallocating additional counters 514 to record errors in this die 508, the regions 512 of the die 508 become smaller. Referring to block 612 of FIG. 6 and to FIG. 7B, the controller 502 detects a second error pattern in the memory module 506 using the set of error counters 514 having the second granularity. In the example of FIG. 7B, the second error pattern corresponds to region 512D.

The process of blocks 610 and 612 may be repeated with different granularities to precisely determine the size and scope of the region 512 experiencing the persistent fault. This may continue until the error counters 514 indicate that a persistent fault spans multiple regions 512 (which indicates that attempts to sub-divide the regions 512 further will not significantly increase accuracy), until a minimum region size is reached, or until the controller 502 otherwise determines that further sub-divisions will not significantly increase accuracy. When controller 502 has determined the region(s) 512 of the memory die 508 experiencing a persistent fault with sufficient specificity, the method 600 proceeds to block 614. Referring to block 614, the controller 502 marks the region(s) 512 (e.g., region 512D) experiencing the persistent fault as erased in an erasure log 516. The controller may do so without marking other regions of the same memory die 508 as erased (e.g., region 512E).

Once the erased region 512D has been detected, the processes of blocks 604-614 may be continued in order to monitor for error patterns in other regions 512. In the subsequent iterations, when the error counters are initialized in blocks 604 and 610, an error counter 514 may be allocated away from the erased region 512D and reallocated elsewhere in order to speed the evaluation of the other regions 512.

In the examples of FIG. 7C, a subsequent iteration detects an error pattern indicating a persistent fault in region 512F, which is in a different die 508 than regions 512D, which has also experienced a fault, and region 512H, which has not. In the illustrated example, a unit of data is split between region 512F and 512E, which has not been marked erased.

Accordingly, when an ECC engine 504 recovers and/or recreates data in the erased first region 512D and third region 512F in block 616, the ECC engine 504 is able to use data portions or recovery portions stored in region 512E to recover data stored in region 512F. Because the controller 502 precisely identifies the region(s) of the memory module 506 that are experiencing errors, the ECC engine 504 has additional valid data to use for the recovery process.

Figure 8:
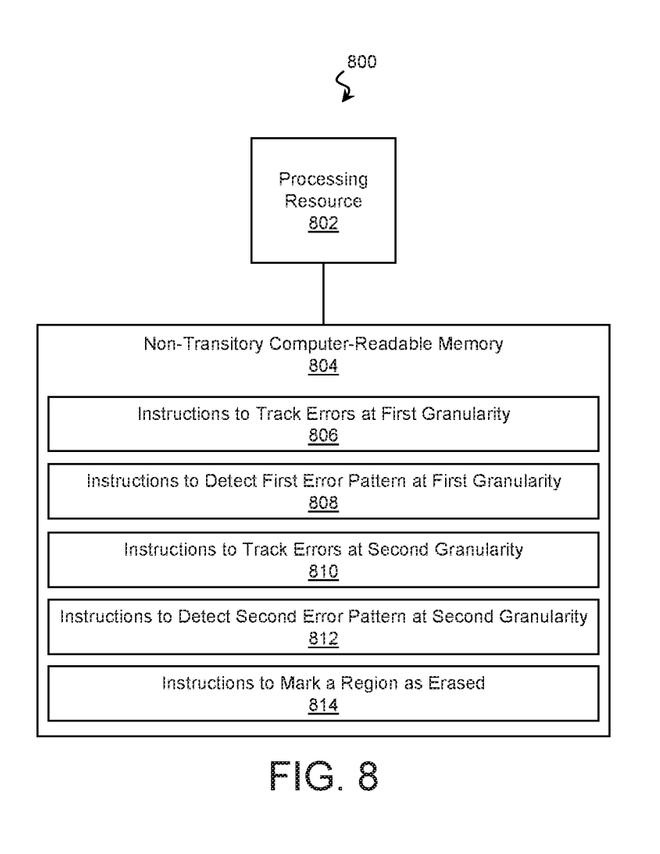
FIG. 8 is a block diagram of a computing system including a non-transitory computer-readable memory resource for responding to memory errors according to some examples of the present disclosure.

The processes of methods 200, 400, and/or 600 may be performed by any combination of hard-coded and programmable logic. In some examples, a processing resource utilizes instructions stored on a non-transitory computer-readable memory resource to perform at least some of these processes. Accordingly, examples of the present disclosure may take the form of a non-transitory computer-readable memory resource storing instructions that perform at least part of methods 200, 400, and/or 600. FIG. 8 is a block diagram of a computing system 800 including a non-transitory computer-readable memory resource for responding to memory errors according to some examples of the present disclosure.

The computing system 800 includes a processing resource 802 communicatively coupled to the non-transitory computer-readable memory resource 804. The processing resource 802 may include any number and combination of CPUs, GPUs, microcontrollers, ASICs, FPGAs, and/or other processing resources, and the non-transitory computer-readable memory resource 804 may include any number of non-transitory memory devices including HDDs, SSDs, other flash memory devices, optical media, battery-backed RAM, and/or other memory devices suitable for storing instructions for the processing resource 802. Accordingly, in various examples, the non-transitory computer-readable memory resource 804 stores instructions for performing processes of method 200, method 400, and/or method 600.

For example, referring to block 806, the non-transitory computer-readable memory resource 804 may store instructions that cause the processing resource 802 to track errors of a plurality of memory dies 108 of a memory module 104 at a first granularity. This may be performed substantially as described in block 404 of FIG. 4 and/or block 604 of FIG. 6. Each memory die 108 may be communicatively coupled in parallel such that each memory die 108 services a respective portion of a data access in parallel.

Referring to block 808, the non-transitory computer-readable memory resource 804 may store instructions that cause the processing resource 802 to detect a first error pattern at the first granularity. This may be performed substantially as described in block 406 of FIG. 4, and/or block 606 of FIG. 6.

Referring to block 810, the non-transitory computer-readable memory resource 804 may store instructions that cause the processing resource 802 to track errors of the plurality of memory dies 108 at a second granularity in response to the first error pattern. The second granularity may be different from the first granularity. This may be performed substantially as described in block 610 of FIG. 6.

Referring to block 812, the non-transitory computer-readable memory resource 804 may store instructions that cause the processing resource 802 to detect a second error pattern at the second granularity. This may be performed substantially as described in block 612 of FIG. 6.

Referring to block 814, the non-transitory computer-readable memory resource 804 may store instructions that cause the processing resource 802 to mark as erased a first memory region 124 of a first memory die 108 in response to the second error pattern. This may be performed substantially as described in block 206 of FIG. 2, block 408 of FIG. 4, and/or block 614 of FIG. 6. The processing resource 802 may mark the first memory region 124 without marking a second memory region 124 of the same memory die 108.

Figure 9:
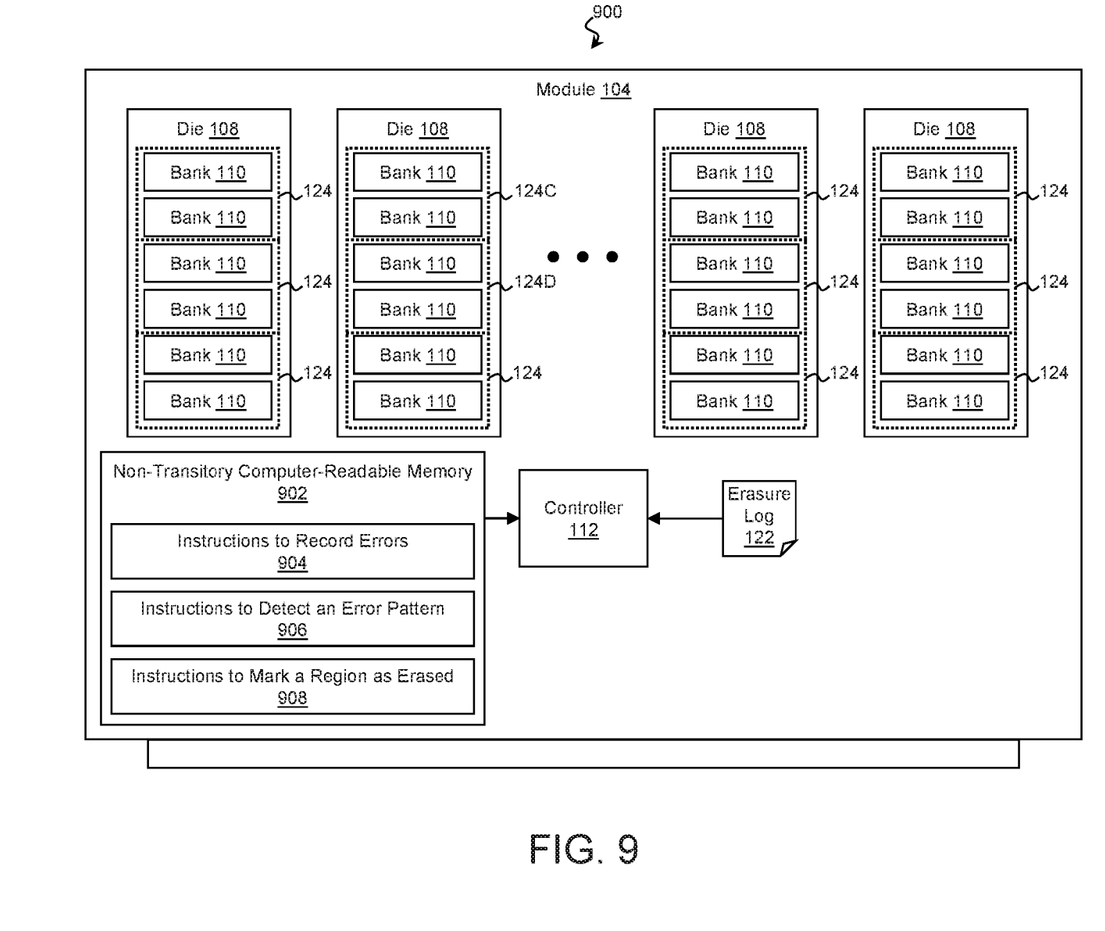
FIG. 9 is a block diagram of a computing system for tracking and correcting memory errors according to some examples of the present disclosure.

FIG. 9 is a block diagram of a computing system 900 for tracking and correcting memory errors according to some examples of the present disclosure. The computing system 900 may be substantially similar to those described above in many regards and may include a controller 112 that is physically incorporated into a memory module 104. It is noted that the controller 112 may also be physically separate from the module 104 and communicatively coupled thereto. In some examples, the memory module 104 includes a plurality of memory dies 108, and in turn, each of the memory dies 108 has a plurality of memory regions 124 defined therein. The memory dies 108 are communicatively coupled in parallel such that each memory die 108 services a respective portion of a data access in parallel.

The controller 112 may perform any of the processes of methods 200, 400, and/or 600 to monitor for memory errors and to take corrective action. In that regard, the controller 112 may be communicatively coupled to a non-transitory computer-readable memory resource 902 that includes any number of non-transitory memory devices including HDDs, SSDs, other flash memory devices, optical media, battery-backed RAM, and/or other memory devices suitable for storing instructions for the controller. The non-transitory computer-readable memory resource may store instructions to perform any part of these methods.

In some examples, the non-transitory computer-readable memory resource 902 stores instructions that cause the controller 112 to record errors of the plurality of memory regions 124 as indicated by block 904. This may be performed substantially as described in block 404 of FIG. 4 and/or block 604 of FIG. 6.

Referring to block 906, the non-transitory computer-readable memory resource 902 stores instructions that cause the controller 112 to detect an error pattern in a first memory region 124C of the plurality of memory regions 124. This may be performed substantially as described in block 204 of FIG. 2, block 406 of FIG. 4, and/or blocks 606 and 612 of FIG. 6. The first memory region 124C may be associated with a first die 108.

Referring to block 908, the non-transitory computer-readable memory resource 902 stores instructions that cause the controller 112 to mark the first memory region 124C as erased such that a second memory region 124D of the first die 108 remains unmarked as erased. This may be performed substantially as described in block 206 of FIG. 2, block 408 of FIG. 4, and/or block 614 of FIG. 6. In some examples, a size of the first memory region 124C depends on the error pattern.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:

1. A method comprising:
   identifying a memory module that includes a plurality of memory dies, wherein each memory die of the plurality of memory dies includes a plurality of memory regions, and wherein each memory die of the plurality of memory dies services a respective portion of a data access;
   detecting an error pattern in a first memory region of the plurality of memory regions, wherein the first memory region is associated with a first memory die of the plurality of memory dies; and
   based on the detected error pattern, marking the first memory region of the first memory die as erased without marking a second memory region of the first memory die as erased.

2. The method of claim 1, wherein the error pattern is a first error pattern, the method comprising:
   detecting a second error pattern in a third memory region of the plurality of memory regions, wherein the third memory region is associated with a second memory die of the plurality of memory dies;
   based on the second error pattern, marking the third memory region as erased; and
   recovering data stored in the erased first memory region and in the erased third memory region.

3. The method of claim 1, wherein the memory module is a Dual In-line Memory Module (DIMM), and wherein each memory die of the plurality of memory dies is a memory die of the DIMM.

4. The method of claim 1, wherein each memory die of the plurality of memory dies is a die of non-volatile memory.

5. The method of claim 1, wherein each memory die of the plurality of memory dies is a die of dynamic random access memory.

6. The method of claim 1, wherein a size of the first memory region depends on the detected error pattern.

7. The method of claim 1 comprising initializing a set of error counters to record errors of the memory module such that each error counter of the set of error counters records errors of a respective memory region of the plurality of memory regions, wherein the detecting of the error pattern is based on the set of error counters.

8. The method of claim 7,
wherein the initializing of the set of error counters includes:
   initializing the set of error counters to record errors of the memory module at a first granularity; and
   in response to detecting an error using the set of error counters having the first granularity, initializing the set of error counters to record errors of the memory at a second granularity that is different from the first granularity, and
wherein the error pattern is detected using the set of error counters having the second granularity.

9. The method of claim 8, wherein a size of the first memory region depends on the second granularity.

10. The method of claim 1 comprising recovering data stored in the first memory region using a remainder of the plurality of memory dies.

11. The method of claim 1, wherein the detecting of the error pattern includes determining whether the error pattern is due to a transient event, and wherein the marking the first memory region of the first memory die as erased is performed based on the error pattern not being due to the transient event.

12. A non-transitory computer-readable memory resource storing instructions that, when executed, cause a processing resource to:
   track errors of a plurality of memory dies of a memory module at a first granularity, wherein each memory die of the plurality of memory dies services a respective portion of a data access in parallel;
   detect a first error pattern at the first granularity;
   in response to the first error pattern, track errors of the plurality of memory dies of the memory modules at a second granularity, wherein the second granularity is different from the first granularity;
   detect a second error pattern at the second granularity; and
   in response to the second error pattern, mark as erased a first memory region of a first memory die of the plurality of memory dies without marking as erased a second memory region of the first memory die.

13. The non-transitory computer-readable memory resource of claim 12 storing instructions that cause the processing resource to:
   detect a third error pattern in a third memory region of a second memory die of the plurality of memory dies;
   based on the third error pattern, mark the third memory region as erased; and
   recover data stored in the erased first memory region and in the erased third memory region.

14. The non-transitory computer-readable memory resource of claim 12, wherein a size of the first memory region depends on the second error pattern.

15. The non-transitory computer-readable memory resource of claim 12, wherein the memory module is a Dual In-line Memory Module (DIMM), and wherein each memory die of the plurality of memory dies is a memory die of the DIMM.

16. The non-transitory computer-readable memory resource of claim 12, wherein each memory die is a die of non-volatile memory.

17. A memory module comprising:
   a plurality of memory dies each having a plurality of memory regions and coupled such that each memory die of the plurality of memory dies services a respective portion of a data access in parallel;
   a controller coupled to the plurality of memory dies; and
   a non-transitory computer readable memory resource that stores instructions that, when executed, cause the controller to:
      record errors of the plurality of memory regions;
      detect an error pattern in a first memory region of the plurality of memory regions, wherein the first memory region is associated with a first memory die of the plurality of memory dies; and,
      in response to the error pattern, mark the first memory region as erased, wherein a second memory region of the first memory die remains unmarked as erased, and wherein a size of the first memory region depends on the error pattern.

18. The memory module of claim 17, wherein the error pattern is a first error pattern, and wherein the non-transitory computer readable memory resource stores instructions that cause the controller to:
   detect a second error pattern in a third memory region of the plurality of memory regions, wherein the third memory region is associated with a second memory die of the plurality of memory dies;
   in response to the second error pattern, mark the third memory region as erased.

19. The memory module of claim 17, wherein the memory module is a Dual In-line Memory Module (DIMM), and wherein each memory die of the plurality of memory dies is a memory die of the DIMM.

20. The memory module of claim 17, wherein the error pattern is a second error pattern, and wherein the instructions that cause the controller to record errors of the plurality of memory regions include instructions that cause the controller to:
   initialize a set of error counters to record errors of the memory module at a first granularity; and
   in response to a first error pattern detected using the set of error counters having the first granularity, initialize the set of error counters to record errors of the memory module at a second granularity that is different from the first granularity, wherein the second error pattern is detected using the set of error counters having the second granularity.

* * * * *